(12) United States Patent
Hwang et al.

(10) Patent No.: US 7,850,087 B2
(45) Date of Patent: Dec. 14, 2010

(54) SEMICONDUCTOR DEVICE AND METHOD OF MANUFACTURING THE SAME

(75) Inventors: Yi-sung Hwang, Asan-si (KR); Sung-dae Cho, Cheonan-si (KR)

(73) Assignee: Samsung Electronics Co. Ltd., Gyeonggi-do (KR)

( * ) Notice: Subject to any disclaimer, the term of this patent is extended or adjusted under 35 U.S.C. 154(b) by 1550 days.

(21) Appl. No.: 11/176,326

(22) Filed: Jul. 8, 2005

(65) Prior Publication Data

US 2006/0118641 A1 Jun. 8, 2006

(30) Foreign Application Priority Data

Dec. 8, 2004 (KR) .................. 10-2004-0103095

(51) Int. Cl.
*G06K 19/06* (2006.01)
*G06K 19/00* (2006.01)

(52) U.S. Cl. ...................... 235/492; 235/487
(58) Field of Classification Search ........... 235/441, 235/451, 487, 492
See application file for complete search history.

(56) References Cited

U.S. PATENT DOCUMENTS

| | | | | |
|---|---|---|---|---|
| 4,555,619 | A * | 11/1985 | Anderson | 235/492 |
| 4,565,922 | A * | 1/1986 | Anderson | 235/492 |
| 6,618,258 | B2 * | 9/2003 | Goris | 361/737 |
| 7,114,659 | B2 * | 10/2006 | Harari et al. | 235/492 |
| 7,152,801 | B2 * | 12/2006 | Cuellar et al. | 235/492 |
| 7,500,610 | B1 * | 3/2009 | Hadley et al. | 235/451 |
| 2003/0029921 | A1 * | 2/2003 | Akita et al. | 235/492 |
| 2003/0226901 | A1 * | 12/2003 | Kim et al. | 235/492 |
| 2004/0037053 | A1 * | 2/2004 | Akita et al. | 361/752 |
| 2008/0036055 | A1 * | 2/2008 | Yee et al. | 257/667 |
| 2008/0042274 | A1 * | 2/2008 | Bang et al. | 257/737 |

FOREIGN PATENT DOCUMENTS

| | | |
|---|---|---|
| JP | 11-105477 | 4/1999 |
| JP | 16-2004-287472 | 10/2004 |
| KR | 1999-0015021 | 5/1999 |
| KR | 2000-0036381 | 7/2000 |

OTHER PUBLICATIONS

Korean Office Action dated Jul. 21, 2006 for Korean counterpart Application No. 10-2004-0103095 with English translation.

* cited by examiner

*Primary Examiner*—Thien M. Le
*Assistant Examiner*—April A Taylor
(74) *Attorney, Agent, or Firm*—Harness, Dickey & Pierce, P.L.C.

(57) ABSTRACT

A semiconductor device and method of fabricating the same. The semiconductor device includes at least one first contact pin on a first substrate and at least one second contact pin on a second substrate. The at least one first and second contact pins may be included in first and second contact pin arrays. The first and second contact pins of the first and second contact pin arrays may be aligned.

39 Claims, 11 Drawing Sheets

| PIN # | MODE | | |
|---|---|---|---|
| | NAME | TYPE | FUNCTION |
| 1 | CD/DAT3[2] | I/O/PP[3] | CARD DETECT/ DATA LINE [BIT3] |
| 2 | CMD | PP | COMMAND/ RESPONSE |
| 3 | $V_{SS1}$ | S | SUPPLY VOLTAGE GROUND |
| 4 | $V_{DD}$ | S | SUPPLY VOLTAGE |
| 5 | CLK | I | CLOCK |
| 6 | $V_{SS2}$ | S | SUPPLY VOLTAGE GROUND |
| 7 | DAT0 | I/O/PP | DATA LINE [BIT0] |
| 8 | DAT1 | I/O/PP | DATA LINE [BIT1] |
| 9 | DAT2 | I/O/PP | DATA LINE [BIT2] |

| PIN # | MODE | | |
|---|---|---|---|
| | NAME | TYPE | FUNCTION |
| 1 | CD/DAT3[2] | I/O/PP[3] | CARD DETECT/ DATA LINE [BIT3] |
| 2 | CMD | PP | COMMAND/RESPONSE |
| 3 | $V_{SS1}$ | S | SUPPLY VOLTAGE GROUND |
| 4 | $V_{DD}$ | S | SUPPLY VOLTAGE |
| 5 | CLK | I | CLOCK |
| 6 | $V_{SS2}$ | S | SUPPLY VOLTAGE GROUND |
| 7 | DAT0 | I/O/PP | DATA LINE [BIT0] |
| 8 | DAT1 | I/O/PP | DATA LINE [BIT1] |
| 9 | DAT2 | I/O/PP | DATA LINE [BIT2] |
| 10 | DAT4 | I/O/PP | DATA LINE [BIT4] |
| 11 | DAT5 | I/O/PP | DATA LINE [BIT5] |
| 12 | DAT6 | I/O/PP | DATA LINE [BIT6] |
| 13 | DAT7 | I/O/PP | DATA LINE [BIT7] |

SEMICONDUCTOR DEVICE AND METHOD OF MANUFACTURING THE SAME

PRIORITY STATEMENT

This application claims the benefit of Korean Patent Application No. 10-2004-0103095, filed on Dec. 8, 2004, in the Korean Intellectual Property Office, the disclosure of which is incorporated herein in its entirety by reference.

BACKGROUND OF THE INVENTION

1. Field of the Invention

The present invention relates to a semiconductor device and a method of manufacturing the same, and more particularly, to a semiconductor device including contact pins and a method of manufacturing the same.

2. Description of the Related Art

Memory cards may be widely used in electronic devices (e.g., multimedia devices, such as digital cameras and MP3 players). A memory card may include a given surface with a contact pin array for providing an electrical connection (e.g., with an associated electronic device). Accordingly, a user of the memory card may need to align the memory card in a proper orientation the memory card into a device's memory slot.

Figure 1A:
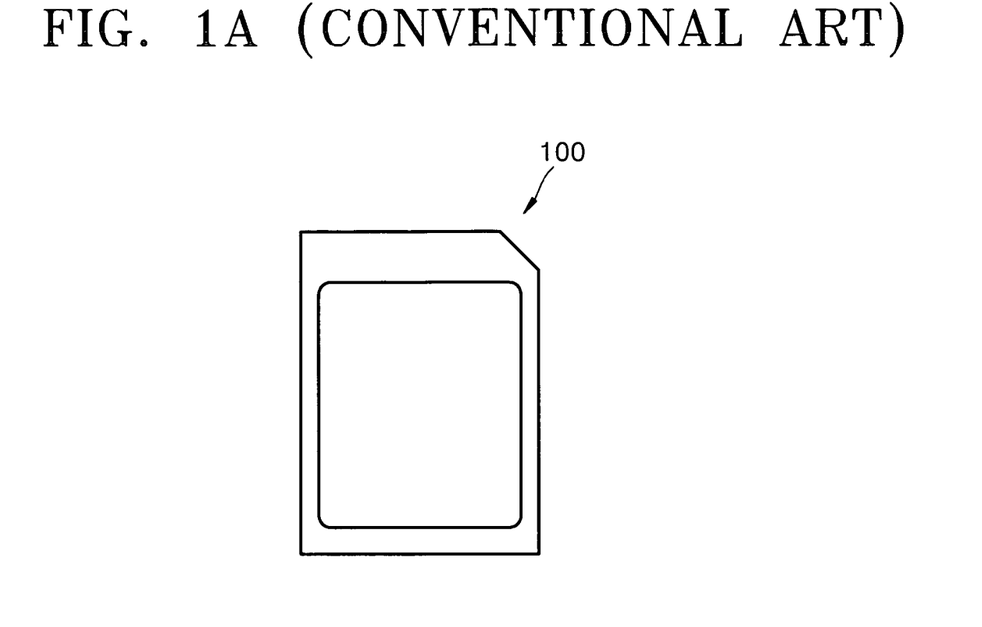
FIG. 1(a) illustrates a front surface of a conventional memory card.
Figure 1B:
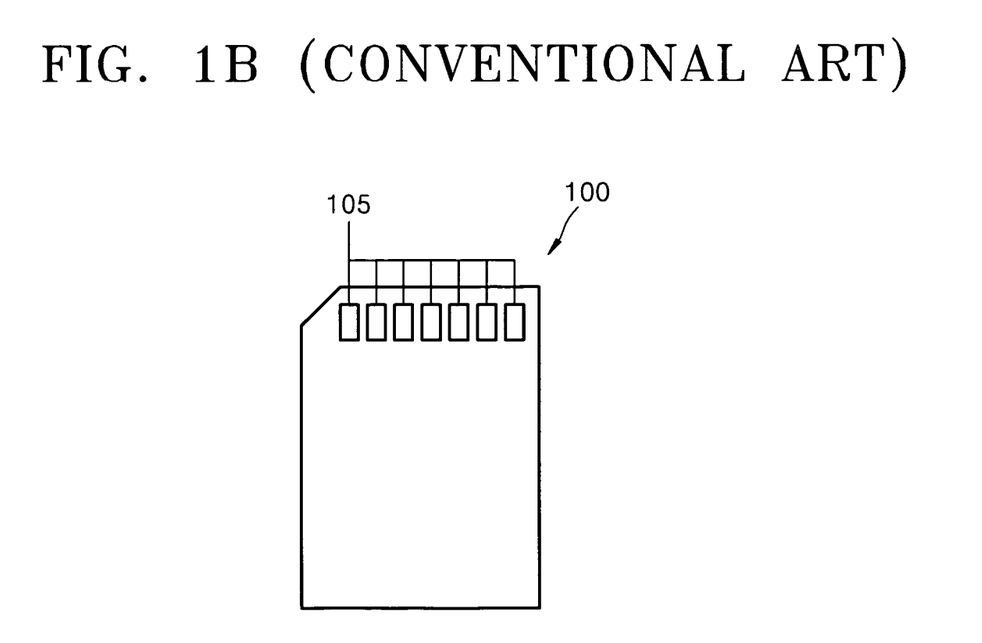
FIG. 1(b) illustrates a rear surface of the conventional memory card.

FIG. 1(a) illustrates a front surface of a conventional memory card 100. FIG. 1(b) illustrates a rear surface of the conventional memory card 100. Referring to FIGS. 1(a) and 1(b), a contact pin array 105 may be formed on the rear surface of the conventional memory card 100 as shown in FIG. 1(b). The front surface of the conventional memory card 100 may not include a contact pin array.

Figure 2:
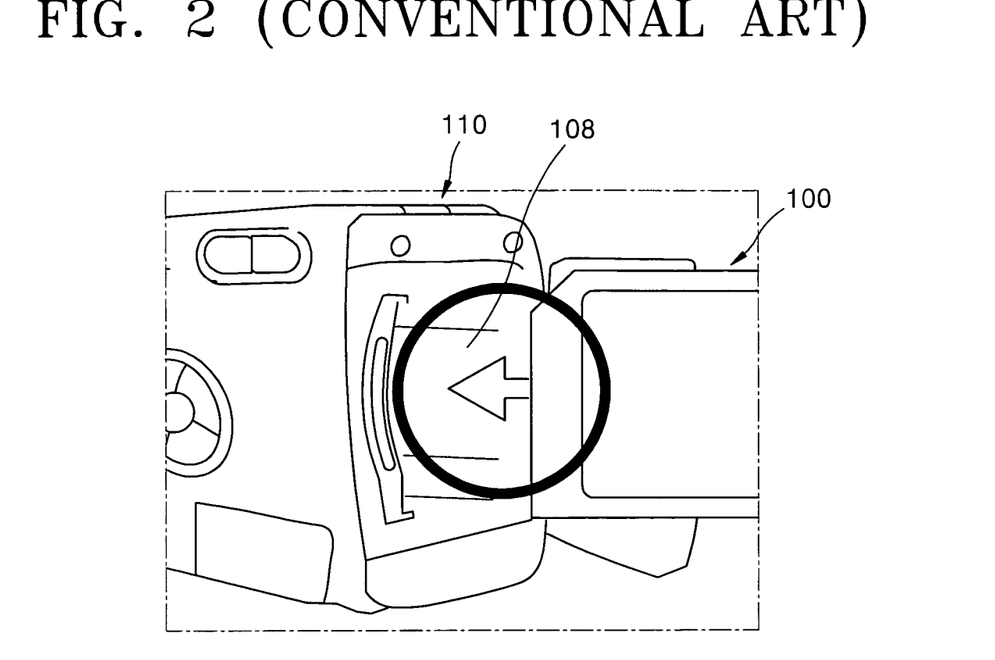
FIG. 2 illustrates an insertion of the conventional memory card into a memory slot of a digital camera.

FIG. 2 illustrates an insertion of the memory card 100 into a memory slot 108 of a digital camera 110. Referring to FIG. 2, if the front surface of the memory card 100 faces upward (e.g., with respect to the digital camera 110), the memory card 100 may fit into the memory slot 108 and may connect to the digital camera 110 (e.g., because the contact pin array 105 may be aligned with the memory slot 108). However, if the rear surface of the memory card 100, as illustrated in FIG. 1(b), faces upward (e.g., with respect to the digital camera 110), the memory card 100 may neither fit into the memory slot 108 nor connect to the digital camera 110, as will be described in greater detail below with reference to FIG. 3.

Figure 3:
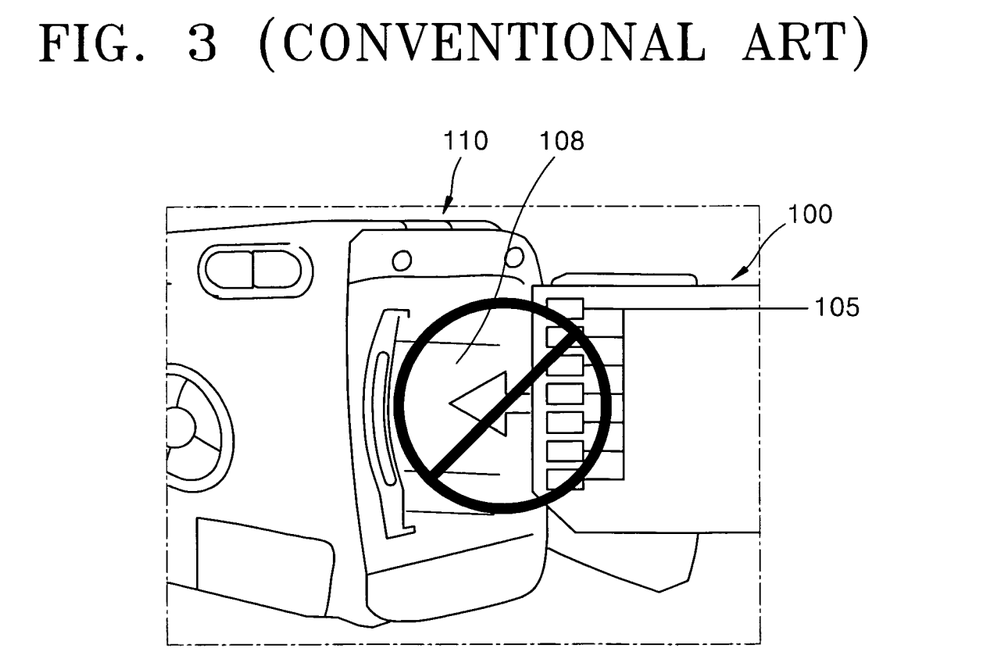
FIG. 3 illustrates an improper insertion of the conventional memory card into the memory slot of the digital camera.

FIG. 3 illustrates an improper insertion of the memory card 100 into the memory slot 108 of the digital camera 110. Unlike the insertion illustrated in FIG. 2, in FIG. 3 the memory card 100 may not fit properly into the memory slot 108 of the digital camera 110 (e.g., because the contact pin array 105 may not be aligned with the memory slot 108). As shown in FIG. 3, if the memory card 100 is forced into the memory slot 108 (e.g., without a proper fit), the memory card 100 and/or the digital camera 110 may be damaged. Further, the memory slot 108 may also be damaged.

Figure 4A:
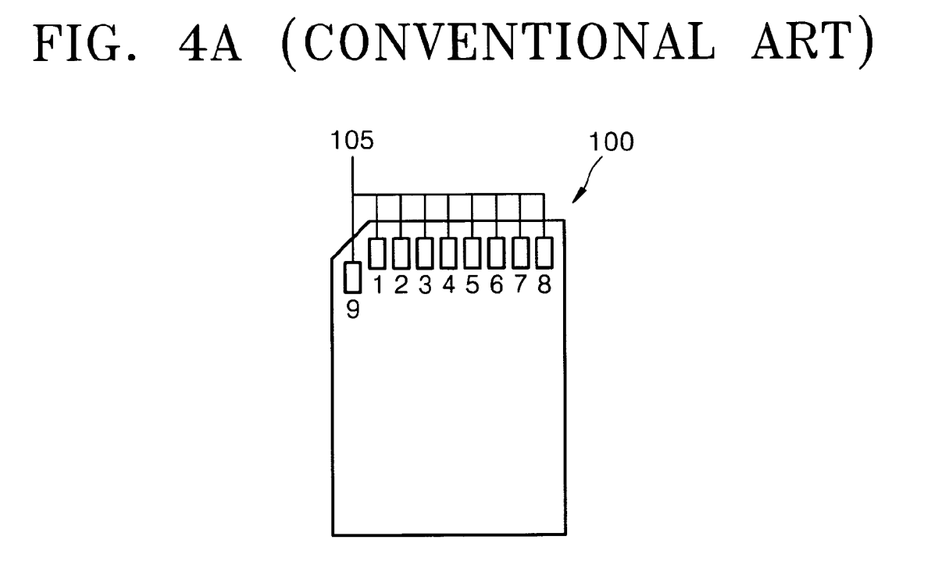
FIG. 4(a) illustrates a contact pin array of the conventional memory card.

FIG. 4(a) illustrates the contact pin array 105 of the memory card 100. Referring to FIG. 4(a), the contact pin array 105 may include contact pins 1 through 9 which may be formed on a given surface or side of the memory card 100 (e.g., for example, on a rear surface).

Figure 4B:
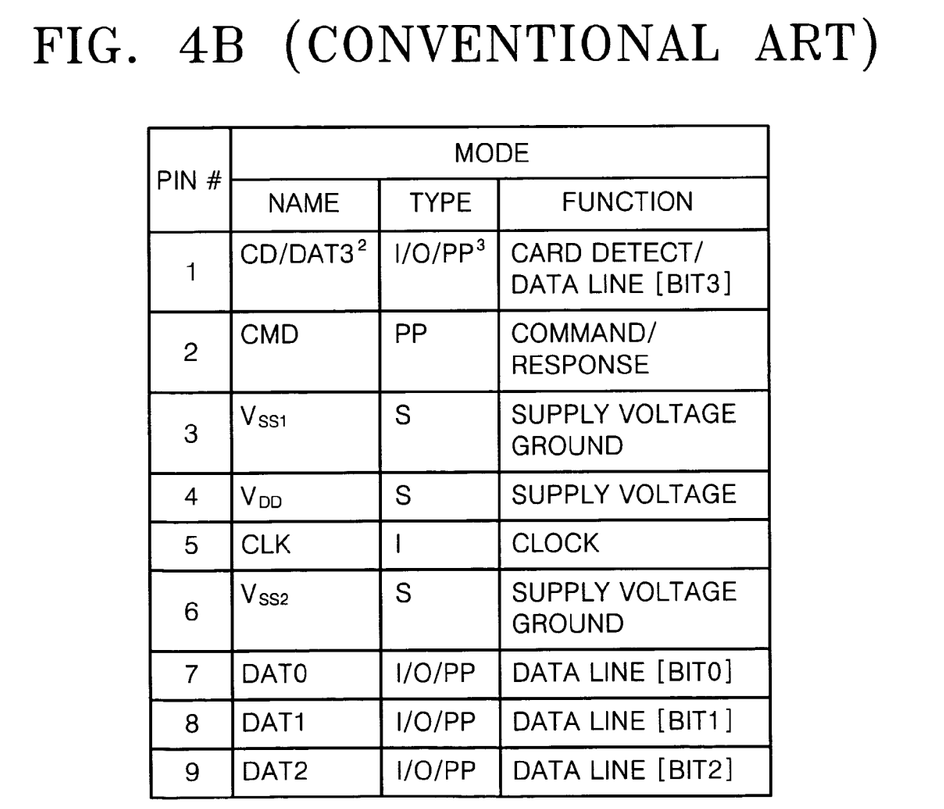
FIG. 4(b) illustrates attributes of contact pins of the contact pin array of FIG. 4(a).

FIG. 4(b) illustrates attributes of the contact pins 1 through 9 of the contact pin array 105 of FIG. 4(a). Referring to FIG. 4(b), the attributes may include a name, a type and a function associated with each of the contact pins 1 through 9. For example, contact pins 1, 7, 8, and 9 may be used as data lines for data transfers to/from the memory device 100.

During an operation where data may be read from the memory card 100, a command (e.g., a read command) may be received by the memory card 100 through contact pin 2 (e.g., for transferring commands to and from the memory card 100) and the memory card 100 may respond to the command (e.g., with an acknowledgment, the requested data, etc.). Data blocks may be output through contact pins 1, 7, 8, and 9, each of which may be designated as data lines. Assuming that the length of a given data block is 8 bits, a transmission of the given data block using the four contact pins 1, 7, 8, and 9 may require at least two clock signals.

Figure 5A:
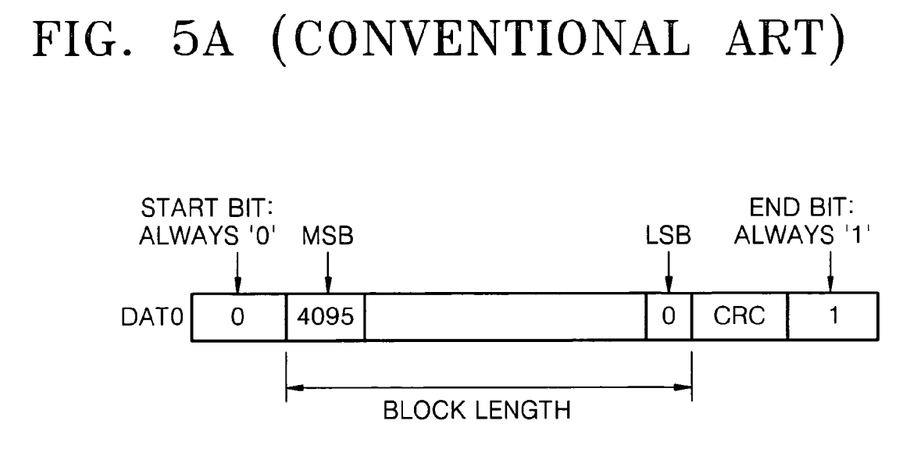
FIG. 5(a) illustrates a conventional data block transmission structure.

FIG. 5(a) illustrates a conventional data block transmission structure. Referring to FIG. 5(a), if a data block is read using a single data line, for example DAT0 (e.g., which may correspond to one of contact pins 1 through 9), the total data length may be 4105 bits. The total data length of 4105 bits may include 4096 bits of the data block to be read, a start bit, an end bit, and 7 cyclic redundancy check (CRC) bits.

Figure 5B:
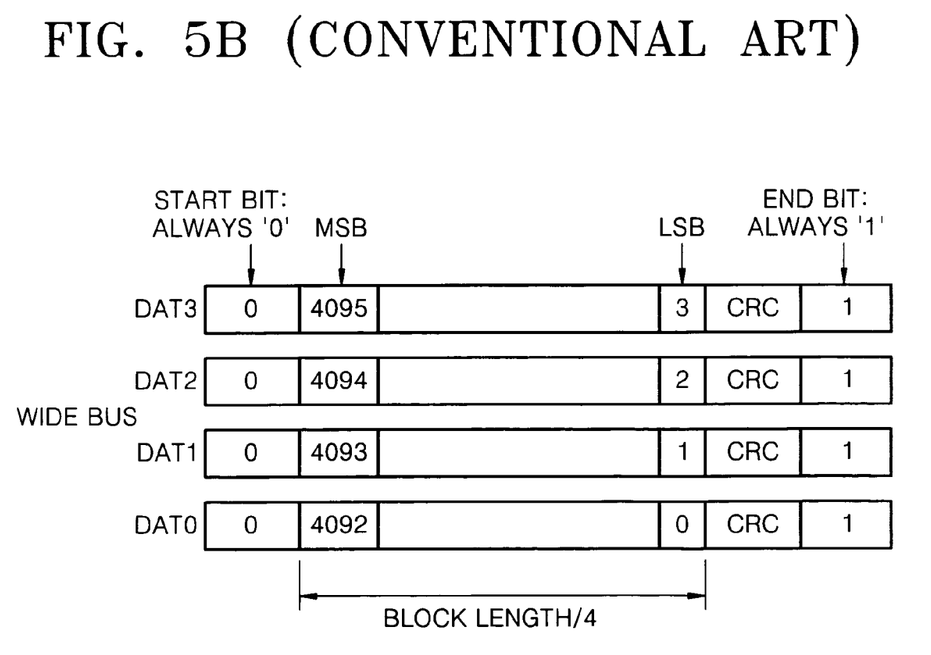
FIG. 5(b) illustrates another conventional data block transmission structure.

FIG. 5(b) illustrates another conventional data block transmission structure. With the above described assumptions, referring to FIG. 5(b), a bus may use data lines DAT3, DAT2, DAT1, and DAT0 to achieve a total data length of 1033 bits for the given data block. The difference (e.g., between the total data lengths of the conventional data block transmission structures of FIG. 5(a) and FIG. 5(b)) may affect a read latency (e.g., a time between a read request and a completion of the sending of the requested read data). For example, if one bit is read per clock cycle using a conventional 25 MHz clock oscillator, data transmission may take 164 nanoseconds (ns) (e.g., as in FIG. 5(a)). In another example, when using the bus with data lines DAT3, DAT2, DAT1 and DATA0, as illustrated in FIG. 5(b), data transmission may take 1 ns (e.g., as in FIG. 5(b).

In another example, assuming the conventional 25 MHz clock oscillator may be used to read a data block of 1 megabyte (Mbyte), a lower limit for the data transmission speed may be 0.32 seconds when using the single data line of FIG. 5(a) and the lower limit may be 0.08 seconds when using the bus of FIG. 5(b). Further, the transmission time may be further increased by the command and response through the command line. Therefore, the memory card 100 may not be used for conventional applications where data may be required to be read or written with a latency less than a given threshold (e.g., 0.08 seconds). Further, while increasing a number of data lines may decrease the latency for a memory device (e.g., memory card 100), it may be difficult to increase the number of data lines while also satisfying other desired system requirements, such as reducing a size of the memory device.

SUMMARY OF THE INVENTION

An example embodiment of the present invention is directed to a semiconductor device, including a first substrate with at least one first contact pin on a first surface, at least one semiconductor chip mounted on the first substrate and connected to the at least one contact pin and a second substrate with at least one second contact pin on a second surface, the at least one second contact pin connected to at least one of the at least one first contact pin and the at least one semiconductor chip.

Another example embodiment of the present invention is directed to a method of manufacturing a semiconductor device, including preparing a first substrate including a plurality of semiconductor chips, separating the plurality of semiconductor chips, attaching at least one of the separated plurality of semiconductor chips to a second substrate, attaching a third substrate to the second substrate and electrically connecting the attached at least one separated semiconductor chip to at least one of the second and third substrates.

Another example embodiment of the present invention is directed to a semiconductor device, including at least one substrate having a first contact pin array on a first surface and a second contact pin array on a second surface, at least a portion of the first and second contact pin arrays being aligned and electronically connected to each other.

BRIEF DESCRIPTION OF THE DRAWINGS

The accompanying drawings are included to provide a further understanding of example embodiments of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Hereinafter, example embodiments of the present invention will be described in detail with reference to the accompanying drawings.

In the Figures, the same reference numerals are used to denote the same elements throughout the drawings.

Figure 6A:
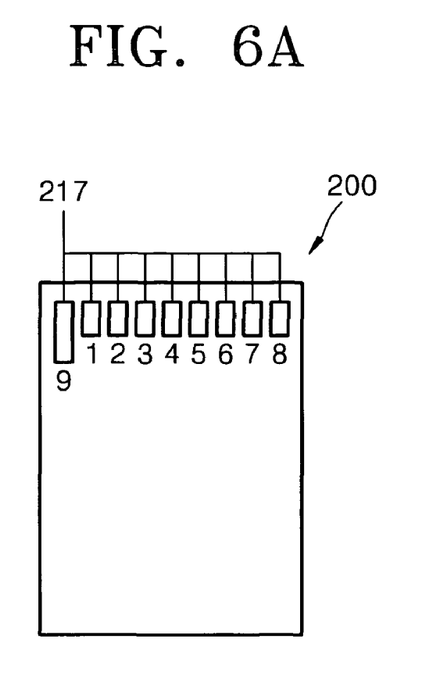
FIG. 6(a) illustrates a front contact pin array of a memory card according to an example embodiment of the present invention.

FIG. 6(a) illustrates a front contact pin array 217 of a memory card 200 according to an example embodiment of the present invention.

Figure 6B:
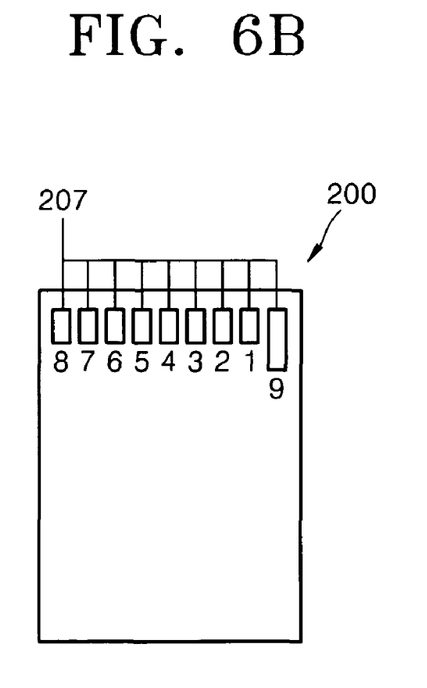
FIG. 6(b) illustrates a rear contact pin array of the memory card of FIG. 6(a) according to another example embodiment of the present invention.

FIG. 6(b) illustrates a rear contact pin array 207 of the memory card 200 according to another example embodiment of the present invention.

In the example embodiment of FIG. 6(a), the front surface of the memory card 200 may include the front contact pin array 217 with first contact pins 1 through 9. In the example embodiment of FIG. 6(b), the rear surface of the memory card 200 may include the rear contact pin array 207 with second contact pins 1 through 9. In the front contact pin array 217, the first contact pins may be arranged with the first contact pin 9 located on a first side (e.g., a left side) of the memory card 200 with the other first contact pins 1-8 positioned away from the first side of the first contact pin 9 in an order beginning with first contact pin 1 and ending with first contact pin 8. Likewise, in the rear contact pin array 207, the second contact pins may be arranged with the second contact pin 9 located on a second side (e.g., a right side) of the memory card 200 with the other second contact pins 1-8 positioned away from the second side of the second contact pin 9 in an order beginning with second contact pin 1 and ending with second contact pin 8.

In the example embodiment of FIGS. 6(a) and 6(b), if the front surface (illustrated in FIG. 6(a)) or the rear surface (illustrated in FIG. 6(b) of the memory card 200 is reversed or flipped, the first and second contact pins 1-9 may be aligned. Thus, the memory card 200 may be inserted into a memory slot irrespective of whether the memory card 200 may be oriented correctly, with the assumption that an edge of the memory card 200 where the front/rear contact pin array 217/207 may be arranged to be inserted into the memory slot (e.g., of a multimedia device) (e.g., where the memory slot may only include pins to connect with the front/rear contact pin array 217/207).

In the example embodiment of FIGS. 6(a) and 6(b), the front/rear contact pin array 217/207 may be a straight linear contact pin array. However, it is understood that other example embodiments of the present invention may employ any type of aligned or symmetrical arrangement (e.g., where an orientation of the memory card 200 may not be a factor in connecting the memory card 200 to a memory slot).

Figure 7:
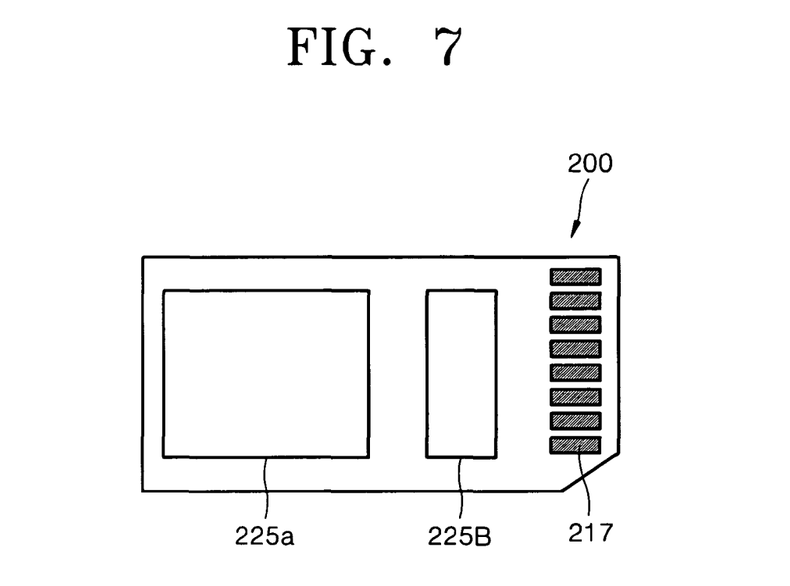
FIG. 7 is a plan view of the memory card of FIGS. 6(a) and 6(b) according to another example embodiment of the present invention.

FIG. 7 is a plan view of the memory card 200 according to another example embodiment of the present invention.

Figure 8:
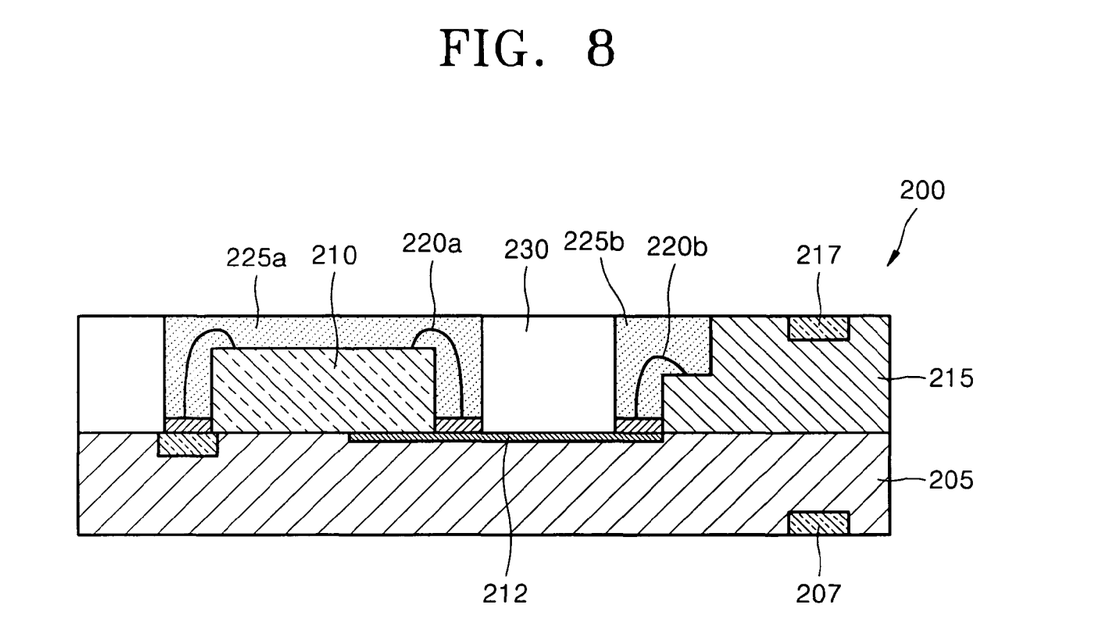
FIG. 8 is a cross-sectional view of the memory card of FIG. 6(a) and 6(b) according to another example embodiment of the present invention.

FIG. 8 is a cross-sectional view of the memory card 200 according to another example embodiment of the present invention.

In the example embodiment of FIG. 8, a memory chip 210 and a second printed circuit substrate 215 may be mounted on a first printed circuit substrate 205. The second printed circuit substrate 215 may be an auxiliary printed circuit substrate for forming a front contact pin array 217 on a front surface of the memory card 200.

In the example embodiment of FIG. 8, a rear contact pin array 207 may be formed on the rear surface of the first printed circuit substrate 205. The memory chip 210 may be connected to the first printed circuit substrate 205 using a conductive wire 220a (e.g., a gold wire, a copper wire, etc.). The conductive wire 220a may be connected to the rear contact pin array 207 through inner wiring (not shown) of the first printed circuit substrate 205. The memory chip 210 may communicate with an external device through the rear contact pin array 207.

In the example embodiment of FIG. 8, the second printed circuit substrate 215 may include the front contact pin array 217 on its front surface. The front contact pin array 217 may be connected to the first printed circuit substrate 205 through a conductive wire 220b. The conductive wire 220a (e.g., connected to the memory chip 210) and the conductive wire 220b (e.g., connected to the second printed circuit substrate 215) may be connected through a connecting wire 212 of the first printed circuit substrate 205. Accordingly, the front contact pin array 217 and the rear contact pin array 207 may be connected to each other. In an example, if a card slot of an external device (e.g., a digital camera) is connected to either the front contact pin array 217 or the rear contact pin array 207, the card slot may connect to the memory chip 210. In an example, a portion of the front/rear contact pins 207/217 may not connect to the memory chip 200.

In the example embodiments of FIGS. 7 and FIG. 8, molding layers 225a and 225b may be molded over the conductive wires 220a and 220b (e.g., for protection). A housing 230 may surround at least a portion of the upper surface (e.g., an entirety of the upper surface) of the memory card 200 including the memory chip 210 and may protect the memory card 200 from, for example, external impact. The housing 230 may not surround the front/rear contact pin arrays 207/217.

Figure 9A:
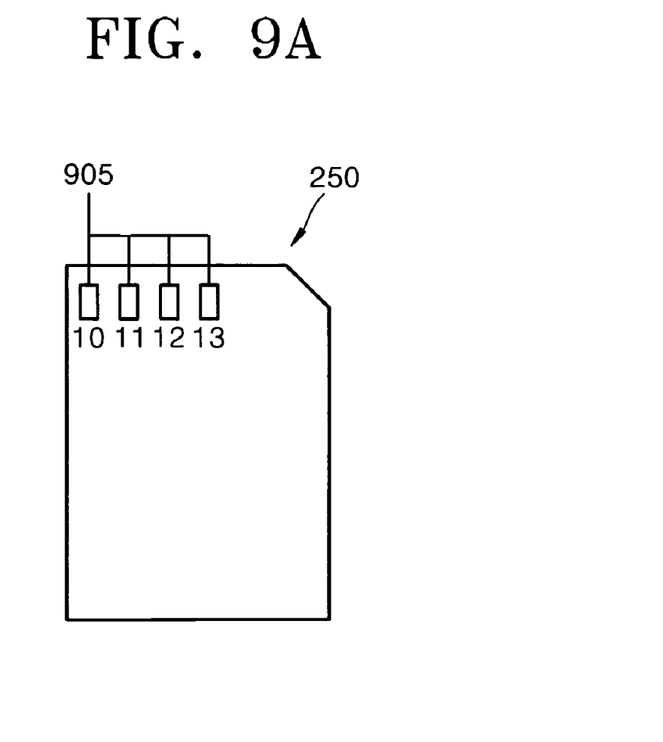
FIG. 9(a) illustrates a front contact pin array of another memory card according to another example embodiment of the present invention.
Figure 9B:
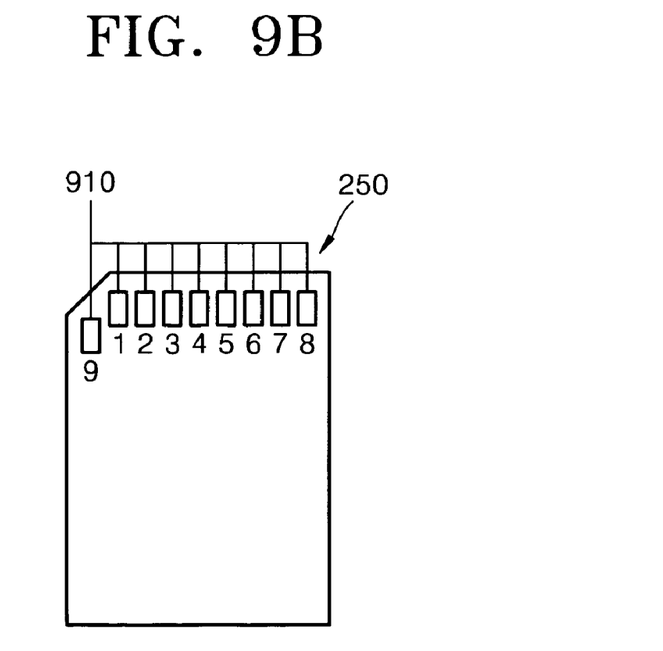
FIG. 9(b) illustrates a rear contact pin array of the memory card of FIG. 9(a) according to another example embodiment of the present invention.

FIG. 9(a) illustrates a front contact pin array 905 of a memory card 250 according to another example embodiment of the present invention. FIG. 9(b) illustrates a rear contact pin array 910 of the memory card 250 according to another example embodiment of the present invention.

In the example embodiments of FIGS. 9(a) and 9(b), the rear contact pin array 910 may be similar to the to the front contact pin array 217 of the memory card 200. However, the front contact pin array 905 may further include contact pins 10-13.

In the example embodiment of FIGS. 9(a) and 9(b), the rear contact pin array (e.g., including contact pins 1 through 9) may be arranged in a straight line on the rear surface of the memory card 250 and the front contact pin array 905 (e.g., including contact pins 10 through 13) may be arranged in a straight line on the front surface of the memory card 250.

Figure 10:
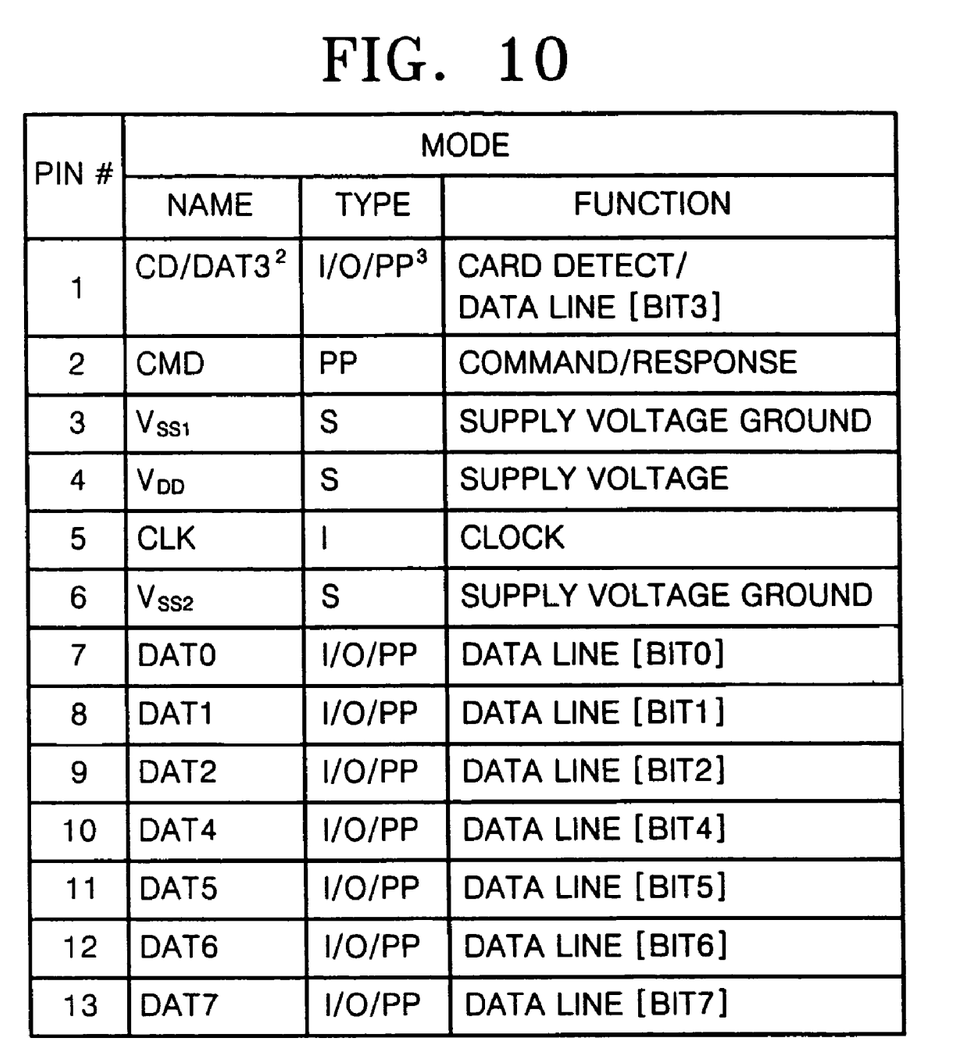
FIG. 10 illustrates functions of contact pins of the rear contact pin array of FIG. 9(b) and contact pins of the front contact pin array of FIG. 9(a) according to another example embodiment of the present invention.

FIG. 10 illustrates functions of the contact pins 1-9 of the rear contact pin array 910 of FIG. 9(b) and contact pins 10-13 of the front contact pin array 905 of FIG. 9(a) according to another example embodiment of the present invention.

In the example embodiment of FIG. 10, data lines DAT0-DAT7 may be assigned to contact pins in the front/rear contact pin arrays 905/910 of the memory card 250. For example, data lines DAT0, DAT1 and DAT2 may be assigned to the contact pins 7, 8 and 9, respectively, of the rear contact pin array 910 of FIG. 9(b). Data lines DAT4, DAT5, DAT6, and DAT7 may be assigned to the contact pins 10, 11, 12 and 13, respectively, in the front contact pin array 905 of FIG. 9(a).

In another example embodiment of the present invention, referring to FIGS. 9(a), 9(b) and 10, data may be accessed and transmitted at an increased speed (e.g., with less latency) because additional data lines (e.g., DAT4-DAT7) may be used (e.g., as compared to the conventional memory card 100 of FIG. 1).

In another example embodiment of the present invention, referring to FIGS. 9(a), 9(b) and 10, a chip size of a memory card (e.g., memory card 250) may be reduced by extending a contact pin array from a rear surface to a front surface of the memory card.

In another example embodiment of the present invention, a cross-sectional structure of the memory card 250 may be similar to a cross-sectional structure of the memory card 200. However, in the memory card 250, the rear contact pin array 910 and the front contact pin array 905 may not be symmetrical. In an example, the front contact pin array 905 and the rear contact pin array 910 may be connected to the memory chip 210 separately (e.g., with no electrical inter-connections). In an alternative example, the front contact pin array 905 and the rear contact pin array 910 may be at least partially electrically connected.

Figure 11:
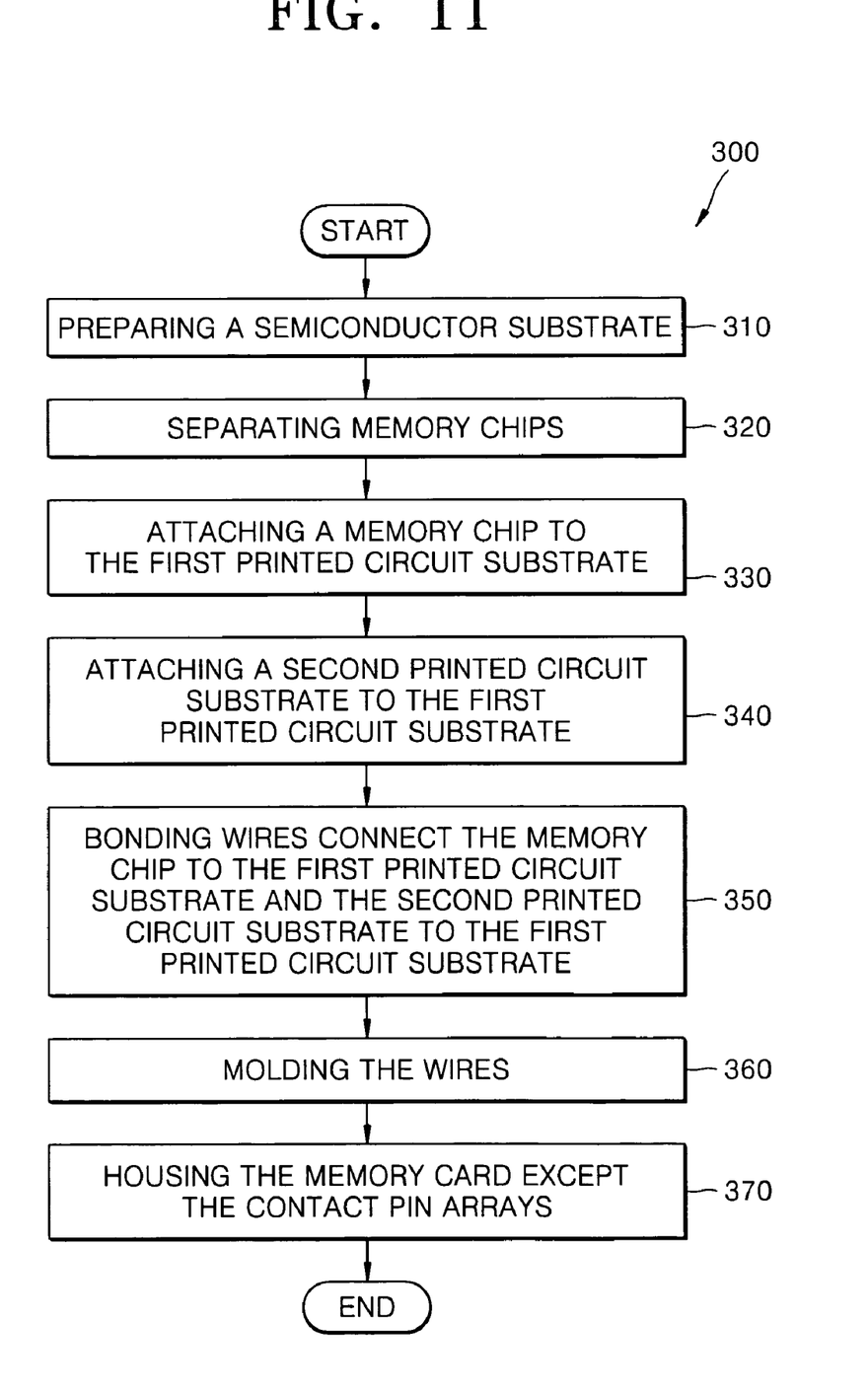
FIG. 11 is a flow chart illustrating a manufacturing process of a semiconductor device according to another example embodiment of the present invention.

FIG. 11 is a flow chart illustrating a manufacturing process 300 of a semiconductor device according to another example embodiment of the present invention.

FIGS. 12 through 15 are cross-sectional views of a semiconductor device at different stages of the manufacturing process 300 of FIG. 11.

An example embodiment of the manufacturing process 300 of FIG. 11 will now be described in detail with reference to FIGS. 12-15.

In the example embodiment of FIG. 11, a semiconductor substrate including a plurality of memory chips may be prepared (at 310). The plurality of memory chips may be separated (at 320). In an example, the plurality of memory chips may be separated by sawing the semiconductor substrate.

In another example embodiment of the present invention, while not shown in the manufacturing process 300 of FIG. 11, an operation for attaching an adhesive (e.g., tape) to the rear surface of the semiconductor substrate may be performed before separating the plurality of memory chips (at 320). In another alternative example embodiment of the present invention, an operation for baking printed circuit substrates may be performed after separating the plurality of memory chips (at 320). In another example, the preparation of the semiconductor substrate (at 310) and the separating of the plurality of memory chips (at 320) may be performed by any well-known process.

Figure 12:
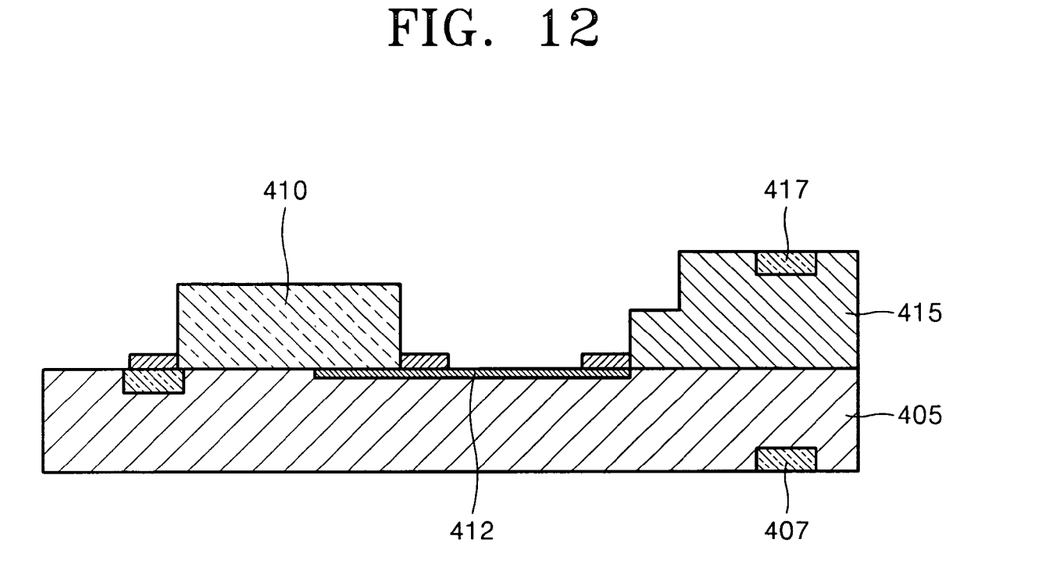
FIGS. 12 through 15 are cross-sectional views of a semiconductor device at different positions of the manufacturing process of FIG. 11.

In the example embodiment of FIG. 12, a memory chip 410 may be attached to a first printed circuit substrate 405 having a front contact pin array 407 on its rear surface (at 330). A second printed circuit substrate 415 having a rear contact pin array 417 on its front surface may be attached to the first printed circuit substrate 405 (at 340).

In the example embodiment of FIG. 12, an electrical connection may be formed between the front contact pin array 407 and the rear contact pin array 417. The electrical connection may be formed with a wiring area 412 in the first printed circuit substrate 405. It is understood that other example embodiments of the present invention need not include the wiring area 412. In another alternative example embodiment of the present invention, the second printed circuit substrate 415 may be located such that the second contact pin array 417 may be aligned with the first contact pin array 407. In a further example embodiment of the present invention, the second printed circuit substrate 415 may be attached such that the rear contact pin array 417 and the front contact pin array 407 may be symmetrical (e.g., as illustrated in FIGS. 6(a) and 6(b)). However, it is understood that other example embodiments of the present invention may not align the front/rear contact pin arrays 407/417 symmetrically (e.g., as illustrated in FIGS. 9(a) and 9(b)). In an example, the second printed circuit substrate 415 may be attached prior to attaching the memory chip 410.

Figure 13:
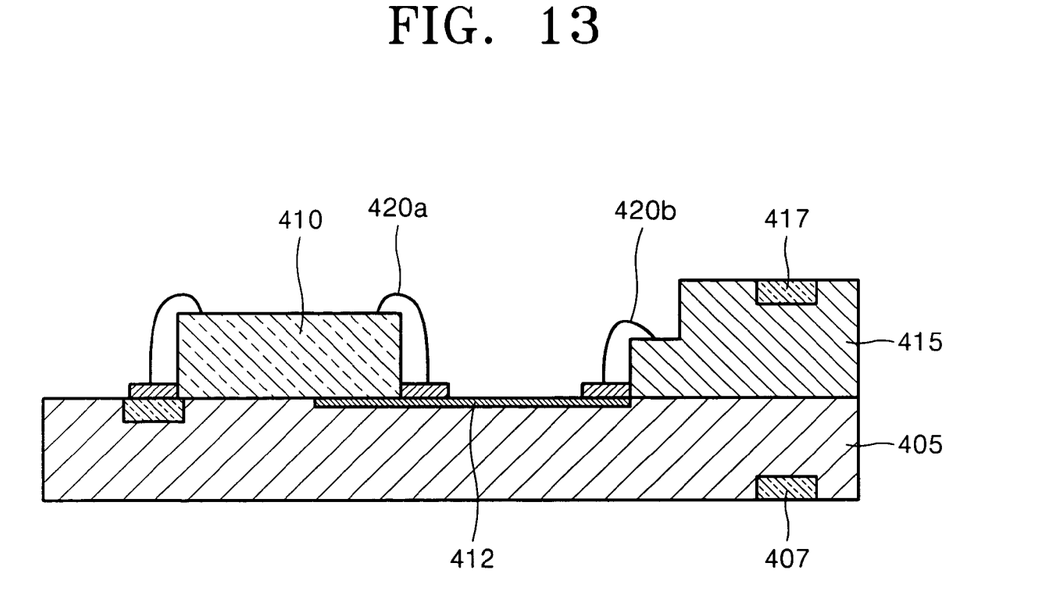

In the example embodiment of FIG. 13, a conductive wire 420a may be bonded to connect the memory chip 410 to the first printed circuit substrate 405 (at 350). A conductive wire 420b may be bonded to connect the second printed circuit substrate 415 to the first printed circuit substrate 405 (at 350).

In another example embodiment of the present invention, the conductive wires 420a and 420b may be bonded to the wiring area 412 of the first printed circuit substrate 405 (e.g., to manufacture a memory card with symmetrical front and rear surfaces). If the conductive wires 420a and 420b are electrically connected to each other, the second printed circuit substrate 415 may be connected to the memory chip 410 and the rear contact pin array 417 may be connected to the memory chip 410. Accordingly, the front contact pin array 407 on the rear surface of the first printed circuit substrate 405 may be electrically connected to the rear contact pin array 417 on the front surface of the second printed circuit substrate 415.

In another example embodiment of the present invention, the front contact pin array 407 and the rear contact pin array 417 may be separately (e.g., no electrical interconnections between the front contact pin array 407 and the rear contact pin array 417) connected to the memory chip 410 (e.g., without being connected by the wiring area 412). The front contact pin array 407 and the rear contact pin array 417 may include separate (e.g., not electrically connected) data lines. The rear contact pin array 417 may be connected to extended data lines.

Figure 14:
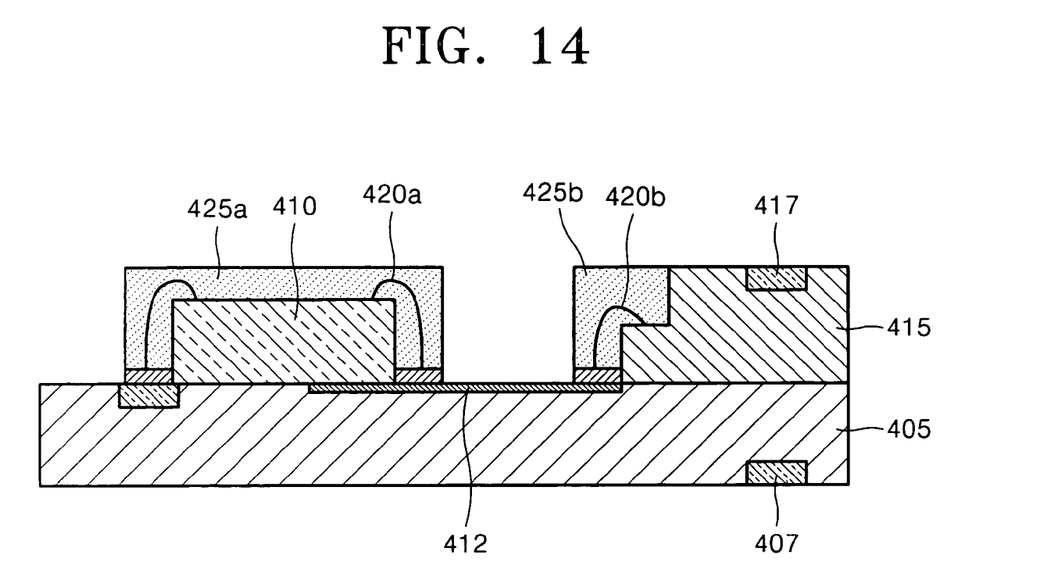

In the example embodiment of FIG. 14, a protective layer may be molded over the conductive wires 420a and 420b (at 360). The molding layers 425a and 425b may be formed separately and may cover the respective conductive wire 420a and 420b. In an example, the molding operation over the conductive wires 420a and 420b may be performed by modifying a mold for forming the molding layer 425a to form the molding layer 425b.

Figure 15:
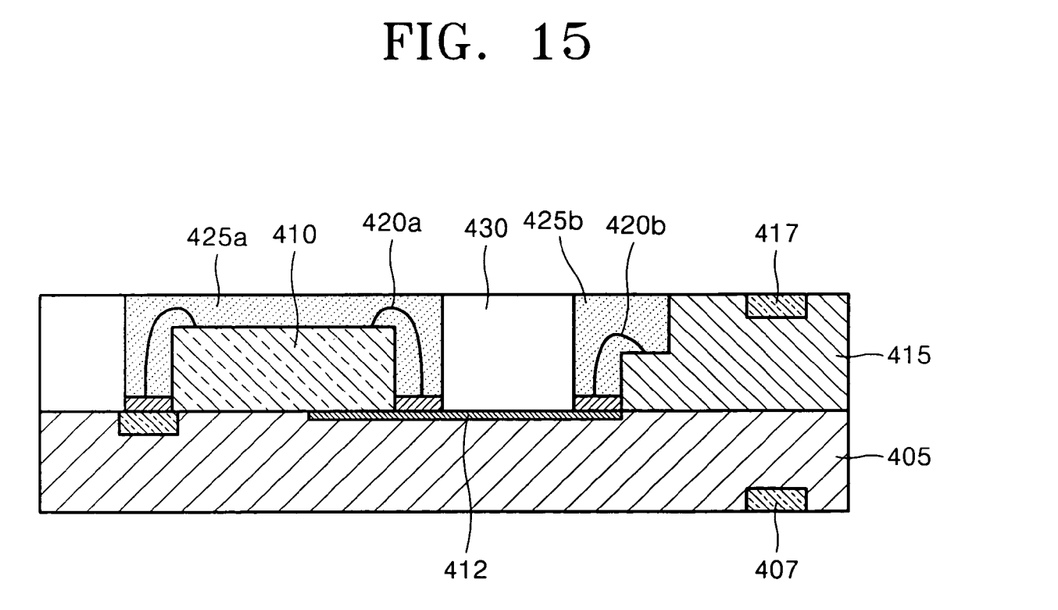

In the example embodiment of FIG. 15, a resultant product (e.g., a product formed after the molding at 360) may be covered by a housing 430 which may expose the front/rear contact pin arrays 407/417 (at 370). The housing 430 may protect the resultant product (e.g., a memory card) from external impact.

In another example embodiment of the present invention, the manufacturing process 300 of FIG. 11 may manufacture/fabricate a semiconductor device (e.g., memory card 200/250) having additional data lines.

In another example embodiment of the present invention, the manufacturing process 300 of FIG. 11 may manufacture/fabricate a semiconductor device (e.g., memory card 200/250) having data lines on a first side (e.g., a front side) and a second side (e.g., a rear side).

Example embodiments of the present invention being thus described, it will be obvious that the same may be varied in many ways. For example, while above described example embodiments are directed to memory cards/chips, other example embodiments of the present invention may apply the above-described apparatuses and/or methods of manufacture to any type of semiconductor device, and not merely semiconductor memory devices. Further, it is understood that other example embodiments may employ a semiconductor device with any number of data lines and/or contact pins on any surface (e.g., a front surface, a rear surface, etc.) of the semiconductor device. Further, the functional assignment of contact pins (e.g., illustrated in FIG. 10) is given as an example only, and it is readily understood that other example embodiments may employ any type of functional assignment to given contact pins.

While above-described example embodiments of the present invention are directed to the first/second sides being one of a front side and a rear side, it is understood that other example embodiments of the present invention may include contact pins and/or contact pin arrays arranged on any surface of a substrate and is not limited to front and/or rear surfaces.

Further, it is understood that the above-described first and second logic levels may correspond to a higher level (e.g., a logic "1") and a lower logic level (e.g., a logic "0"), respectively, in an example embodiment of the present invention. Alternatively, the first and second logic levels/states may correspond to the lower logic level and the higher logic level, respectively, in other example embodiments of the present invention.

Such variations are not to be regarded as departure from the spirit and scope of example embodiments of the present invention, and all such modifications as would be obvious to one skilled in the art are intended to be included within the scope of the following claims.

What is claimed is:

1. A semiconductor device, comprising:
    a first substrate with at least one first contact pin on a first surface;
    at least one semiconductor chip mounted on the first substrate and connected to the at least one contact pin; and
    a second substrate with at least one second contact pin on a second surface, the at least one second contact pin connected to at least one of the at least one first contact pin and the at least one semiconductor chip,
    wherein the first and second substrates are printed circuit substrates,
    wherein the second substrate is directly stacked on the first substrate,
    wherein the first substrate includes a first wiring connected to the at least one first contact pin and the second substrate includes a second wiring connected to the at least one second contact pin.

2. The semiconductor device of claim 1, wherein the at least one first contact pin is included in a first contact pin array and the at least one second contact pin is included in a second contact pin array.

3. The semiconductor device of claim 2, wherein the at least one first contact pin of the first contact pin array and the at least one second contact pin of the second contact pin array are arranged symmetrically.

4. The semiconductor device of claim 2, each of the first contact pin array and the second contact pin array include a plurality of contact pins arranged in a straight line.

5. The semiconductor device of claim 4, wherein an order of corresponding contact pins in the first contact pin array and the second contact pin array are opposite.

6. The semiconductor device of claim 2, wherein the at least one semiconductor chip is connected to the first contact pin array and the second contact pin array.

7. The semiconductor device of claim 6, wherein the second contact pin array is connected to at least one data line of the at least one semiconductor chip.

8. The semiconductor device of claim 6, wherein the at least one semiconductor chip is connected to the first wiring through a conductive wire.

9. The semiconductor device of claim 6, wherein at least a portion of the second wiring is connected to at least a portion of the first wiring through a conductive wire.

10. The semiconductor device of claim 1, wherein the at least one first contact pin is electrically connected to the at least one second contact pin.

11. The semiconductor device of claim 1, wherein one of the first and second surfaces is a front surface and another of the first and second surfaces is a rear surface.

12. The semiconductor device of claim 1, wherein the at least one semiconductor chip is connected to the first wiring through a conductive wire.

13. The semiconductor device of claim 1, wherein the first wiring and the second wiring are connected through a conductive wire.

14. The semiconductor device of claim 13, wherein the at least one semiconductor chip and the conductive wire are molded with a molding layer.

15. The semiconductor device of claim 1, wherein the at least one semiconductor chip is a memory chip.

16. A method of manufacturing the semiconductor device of claim 1.

17. The semiconductor device of claim 1, wherein the at least one semiconductor chip and the second substrate are placed on the first substrate at a same elevation.

18. The semiconductor device of claim 1, wherein the at least one semiconductor chip is electrically connected with the second substrate by a third wiring formed on a second surface of the first substrate, the first and second surfaces of the first substrate being opposing surfaces.

19. The semiconductor device of claim 1, wherein a top surface of the first and second contact pins are flush with the first and second surfaces of the first and second substrates, respectively.

20. The semiconductor device of claim 1, wherein the at least one semiconductor chip is electrically connected with the first contact pins by a fourth wiring formed inside the first substrate.

21. A method of manufacturing a semiconductor device, comprising:
   preparing a first substrate including a plurality of semiconductor chips;
   separating the plurality of semiconductor chips;
   attaching at least one of the separated plurality of semiconductor chips to a second substrate;
   attaching a third substrate to the second substrate; and
   electrically connecting the attached at least one separated semiconductor chip to at least one of the second and third substrates.

22. The method of claim 21, wherein the plurality of semiconductor chips include a plurality of memory chips.

23. The method of claim 21, wherein the separating is performed by sawing at least a portion of the first substrate.

24. The method of claim 21, wherein the second and third substrates are printed circuit substrates.

25. The method of claim 21, wherein the second substrate includes a first contact pin array on a first surface and the third substrate includes a second contact pin array on a second surface.

26. The method of claim 25, wherein attaching the third substrate aligns the first contact pin array with the second contact pin array.

27. The method of claim 26, wherein the alignment is a symmetrical alignment.

28. The method of claim 25, further comprising:
   covering the semiconductor device with a housing exposing at least a portion of the at least one of the first and second contact pin arrays after molding.

29. The method of claim 21, wherein the electrically connecting includes bonding at least one conductive wire between the attached at least one separated semiconductor chip and at least one of the second and third substrates and between the second and third substrates.

30. The method of claim 29, further comprising:
   molding the conductive wire.

31. The method of claim 21, further comprising:
   attaching an adhesive to a surface of the first substrate before separating the semiconductor chips.

32. The method of claim 21, further comprising:
   baking the second substrate after separating the plurality of semiconductor chips.

33. A memory card, comprising:
   at least one substrate having a first contact pin array on a first surface of the memory card and a second contact pin array on a second surface of the memory card, at least a portion of the first and second contact pin arrays being aligned and electronically connected to each other,
   wherein the at least one substrate includes a first substrate and a second substrate,
   wherein the first and second substrates are printed circuit substrates,
   wherein the second substrate is directly stacked on the first substrate.

34. The memory card of claim 33, wherein the first surface is a front surface of the memory card and the second surface is a rear surface of the memory card.

35. The memory card of claim 33, wherein the first and second contact pin arrays are aligned symmetrically.

36. The memory card of claim 33, further comprising:
   at least one semiconductor chip connected to the first contact pin array and the second contact pin array and mounted on the at least one substrate.

37. The memory card of claim 36, wherein the at least one semiconductor chip includes at least one memory chip.

38. The memory card of claim 33, the first surface located on the first substrate and the second surface located on the second substrate.

39. A method of manufacturing the memory card of claim 33.

* * * * *